United States Patent [19]

Sarin et al.

[11] Patent Number: 4,751,109
[45] Date of Patent: Jun. 14, 1988

[54] A PROCESS FOR DEPOSITING A COMPOSITE CERAMIC COATING ON A HARD CERAMIC SUBSTRATE

[75] Inventors: Vinod K. Sarin, Lexington, Mass.; Hans E. Hintermann, Ins; Gilbert Gindraux, Neuchatel, both of Switzerland

[73] Assignee: GTE Laboratories Incorporated, Waltham, Mass.

[21] Appl. No.: 5,003

[22] Filed: Jan. 20, 1987

[51] Int. Cl.$^4$ .................. C23C 16/32; C23C 16/40
[52] U.S. Cl. .................. 427/255; 427/249; 427/255.2; 427/255.3; 427/255.7; 427/419.2; 427/419.7
[58] Field of Search .................. 427/255.3, 255, 249, 427/255.2, 255.7, 419.2, 419.7

[56] References Cited

U.S. PATENT DOCUMENTS

| | | | |
|---|---|---|---|
| Re. 29,420 | 9/1977 | Lindstrom et al. | 428/336 |
| Re. 31,526 | 2/1984 | Smith et al. | 75/235 |
| Re. 32,093 | 3/1986 | Hale | 428/336 |
| Re. 32,111 | 4/1986 | Lambert et al. | 428/212 |
| 3,249,460 | 5/1966 | Gerry | 117/70 |
| 3,306,768 | 2/1967 | Peterson | 427/255.3 |
| 3,511,703 | 5/1970 | Peterson | 427/255.3 |
| 3,836,392 | 9/1974 | Lux et al. | 117/169 R |
| 3,914,473 | 10/1975 | Hale | 427/255 |
| 3,955,038 | 5/1976 | Lindstrom et al. | 428/457 |
| 3,967,035 | 6/1976 | Hale | 428/336 |
| 3,977,061 | 8/1976 | Lindstrom et al. | 29/95 R |
| 4,018,631 | 4/1977 | Hale | 427/377 |
| 4,019,873 | 4/1977 | Reiter | 428/217 |
| 4,101,703 | 7/1978 | Schintlmeister | 428/216 |
| 4,112,148 | 9/1978 | Fonzi | 427/255.3 |
| 4,150,195 | 4/1979 | Tohioka et al. | 428/548 |
| 4,282,289 | 8/1981 | Kullander et al. | 427/419.7 |
| 4,463,033 | 7/1984 | Kikuchi et al. | 427/255.3 |
| 4,463,062 | 7/1984 | Hale | 428/698 |
| 4,497,874 | 2/1985 | Hale | 428/551 |
| 4,576,836 | 3/1986 | Colmet et al. | 427/255.3 |
| 4,588,655 | 5/1986 | Kushner | 428/633 |
| 4,609,562 | 9/1986 | Isenberg et al. | 427/255.3 |
| 4,619,865 | 10/1986 | Keem et al. | 428/333 |
| 4,619,866 | 10/1986 | Smith et al. | 427/255.3 |
| 4,629,661 | 12/1986 | Hillert et al. | 428/698 |
| 4,643,951 | 2/1987 | Keem et al. | 428/469 |

*Primary Examiner*—Sadie L. Childs
*Attorney, Agent, or Firm*—Frances P. Craig

[57] ABSTRACT

A process for producing a wear resistant article, such as a cutting tool. Gaseous halides of two or more of aluminum, zirconium, and yttrium with other reactants are passed over a hard ceramic substrate at 900°–1500° C., and at 1 torr to about ambient pressure to form a composite ceramic coating on the substrate. The coating is a continuous first-phase metal oxide matrix having particles of at least one different metal oxide dispersed therein. In a preferred process, one or more of the metal halides is pulsed into the gaseous mixture containing a different metal halide, to control the deposition of the particles.

22 Claims, 1 Drawing Sheet

A PROCESS FOR DEPOSITING A COMPOSITE CERAMIC COATING ON A HARD CERAMIC SUBSTRATE

REFERENCE TO RELATED APPLICATIONS

This application is related to U.S. patent Application Ser. No. (005,000), now U.S. Pat. No. 4,702,970, filed concurrently herewith.

THE FIELD OF THE INVENTION

This invention relates to a method for depositing a wear-resistant coating on a hard ceramic substrate, and more particularly to the deposition of a two or more phase composite oxide coating on such a substrate.

BACKGROUND OF THE INVENTION

Hard ceramic materials are known and are used extensively in such applications as metal cutting and milling tools, wear-resistant machine parts and the like. Hard ceramic materials, as used herein refers to such compositions as $Al_2O_3$, $Si_3N_4$, silicon aluminum oxynitride and related compounds, as hard and dense monolithic or composite materials. The composites include those containing whiskers and/or particulates of SiC, $Si_3N_4$, other ceramic materials, and metal carbides, nitrides, and carbonitrides such as TiC and TiN. It is also known that the service properties such as wear, high temperature and chemical resistance of such materials may be enhanced by the application of one or more thin coatings of, for example, metal carbides, metal nitrides, or ceramics. Great strides have been made in improved performance of these coated substrates, for example in machining applications, by refinement of the substrate compositions and by applying various combinations of superimposed layers of coating materials. However, increasingly stringent use conditions, for example use at high cutting speeds or in extremely high temperatures and/or corrosive environments, are placing increasing demands upon the performance of such materials.

SUMMARY OF THE INVENTION

The invention described herein and recited in the appended claims provides a process for depositing a wear resistant composite coating of controlled composition and distribution on a hard ceramic substrate to produce an article showing improved abrasion resistance under extreme conditions of use.

An improved process for depositing a wear resistant ceramic coating on a hard ceramic substrate according to one embodiment of the invention involves passing over the substrate a first gaseous mixture of a first halide vapor selected from the halides of aluminum, yttrium and zirconium, with other reactant gases, and optionally a carrier gas. The temperature is about 900°–1500° C., and the pressure between about 1 torr and about ambient pressure. The partial pressure ratios, the flow rate, and the length of time is sufficient to deposit a continuous, fully dense, adherent, wear resistant layer of a material selected from the oxides of aluminum, zirconium, and yttrium about 0.1–20 microns thick on the substrate. At least one additional vapor selected from the halides of aluminum, zirconium, and yttrium is mixed with the first gaseous mixture. The additional metal halide vapor is different from the first halide vapor, and is mixed at a partial pressure selected to form at least one discontinuous additional phase, dispersed as discrete particles within the continuous oxide layer, of at least one material selected from the oxides of aluminum, zirconium and yttrium, to form a wear resistant composite ceramic layer on the substrate.

In a preferred process according to the invention, the additional metal halide vapor is mixed with the first mixture by intermittently, during the deposition of the continuous oxide layer, pulsing the additional vapor into the first gaseous mixture to mix therewith. Most preferably, a single-phase oxide portion is deposited before the two or more phase portion and/or the process is controlled to form a stratified composite in which two or more phase portions alternate with single-phase continuous oxide portions.

The process according to another preferred embodiment of the invention involves passing a halide vapor such as $Cl_2$ or HCl, optionally mixed with a carrier gas, over a mixture or alloy of two or more metals selected from aluminum, zirconium, yttrium, and their metal salts at about 250°–1500° C. to form a first gaseous mixture comprising halides of two or more of aluminum, zirconium, and yttrium, and optionally the carrier gas. The first gaseous mixture is mixed with other reactant gases to form a second gaseous mixture. The second gaseous mixture is passed over the substrate at a temperature of about 900°–1500° C. and a pressure between about 1 torr and about ambient pressure, to deposit a composite layer on the substrate. The other reactant gases, the flow rates of the gases, the surface areas and the ratio of the surface areas of the two or more metals, and the deposition time are selected so that the composite layer comprises an adherent layer about 0.1–20 microns thick of a continuous first phase of an oxide of one of the two or more of aluminum, zirconium, and yttrium, and one or more discontinuous additional phases, dispersed as discrete particles within the first-phase layer, of oxides of the remaining of the two or more of aluminum, zirconium, and yttrium.

Another preferred embodiment of the invention involves passing a first gaseous halide, optionally mixed with a first carrier gas, over a first metal selected from the group consisting of aluminum, zirconium, yttrium, and metal salts thereof, at about 250°–1500° C. to form a gaseous first metal halide of aluminum, zirconium, or yttrium. A second gaseous halide, which may be the same or different from the first gaseous halide, optionally mixed with a second carrier gas, which may be the same or different from the first carrier gas, is passed over one or more additional metals selected from aluminum, zirconium, and yttrium, and alloys and metal salts thereof, and different from the first metal, at about 250°–1500° C. to form additional metal halides of one or more of aluminum, zirconium, and yttrium. A gaseous mixture of the first metal halides and the one or more additional metal halides, optionally the carrier gases, and other reactant gases is passed over the substrate, at a temperature of about 900°–1500° C. and at a pressure between about 1 torr and about ambient pressure, to deposit a composite layer on the substrate. The other reactant gases, the flow rates of the vapors, the surface areas of the first metal and the one or more additional metals, and the deposition time are selected so that the composite layer comprises an adherent layer about 0.1–20 microns thick of a continuous first phase of an oxide of one of aluminum, zirconium, and yttrium, having one or more discontinuous additional phases of discrete particles of oxide(s) of one or more of aluminum, zirconium, and yttrium dispersed therein, the additional phase oxide(s) being different from the first-phase oxide.

In yet another preferred embodiment of the process according to the invention, at least one intermediate layer about 0.5–10 microns thick selected from the group consisting of the carbides, nitrides, and carbonitrides of Ti, Zr, Hf, Va, Nb, Ta, Cr, Mo, W, Si, and B is deposited between the substrate and the oxide layer.

In a process according to yet another embodiment of the invention, the step of passing the first halide over the first metal is a continuous step, producing a steady flow of the first metal halide to pass over the substrate, and the step of passing the second halide over the one or more additional metals is an intermittent, pulsing step, producing pulses of the one or more additional metal halide to pass over the substrate with the first metal halide, the second halide being pulsed at intervals and for times selected to control the size and distribution of the additional phase particles within the continuous first phase.

In the most preferred embodiment of the process according to the invention, the step of passing the gaseous mixture over the substrate takes place within a reactor, and at least one of the first metal and the one or more additional metals is disposed within a separate vessel within the reactor. The separate vessel operationally communicates with a source of the associated gaseous halide, and optionally the associated carrier gas, and with the reactor, so that the associated gaseous halide enters the separate vessel, passes over the surfaces of the metal or metals therein to form the metal halide, which flows into the reactor to pass over the substrate as a component of the gaseous mixture.

BRIEF DESCRIPTION OF THE DRAWINGS

For a better understanding of the present invention, together with the objects, advantages, and capabilities thereof, reference is made to the following disclosure and appended claims, taken together with the drawings, of which:

DETAILED DESCRIPTION OF THE INVENTION

Figure 1:
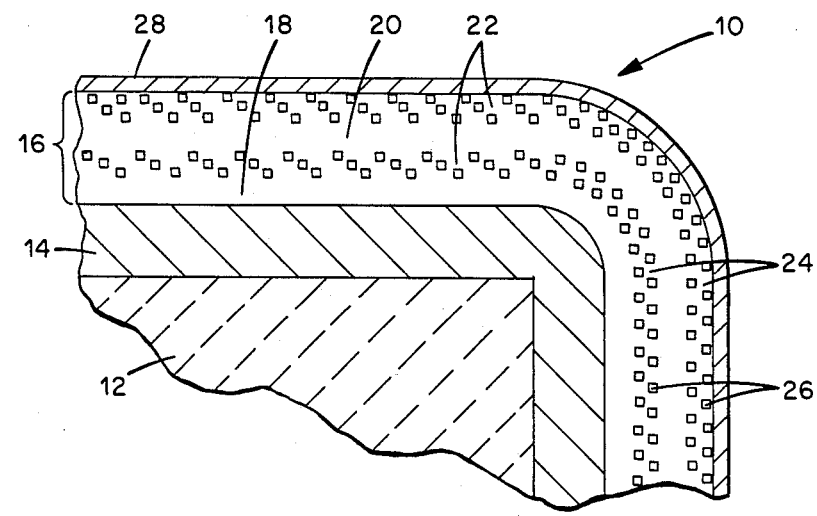
FIGS. 1 and 2 are schematic cross-sectional illustrations of substrates coated by two different embodiments of processes according to the invention.

The process according to the present invention involves deposition of an adherent two or more phase composite oxide-based coating on a hard ceramic substrate, for example, monolithic or composite $Al_2O_3$, $Si_3N_4$, silicon aluminum oxynitride, or related material, as described above.

The deposition of a two or more phase oxide-based composite coating which possesses the properties of adherence to the substrate, wear resistance, high temperature resistance and resistance to chemical attack or breakdown at high temperatures depends on careful control of the process parameters. The outstanding properties of the coating are a result of the achievement of a second phase of discrete particles of $Al_2O_3$, $ZrO_2$ or $Y_2O_3$, or a combination of these, within an $Al_2O_3$, $ZrO_2$, or $Y_2O_3$ matrix. For example, the preferred coatings include $ZrO_2$ and/or $Y_2O_3$ particles within a continuous $Al_2O_3$ matrix, $Y_2O_3$ particles within a continuous $ZrO_2$ matrix, $ZrO_2$ particles within a continuous $Y_2O_3$ matrix, or $YO_3$ stabilized $ZrO_2$ particles, i.e., an $Y_2O_3$-$ZrO_2$ solid solution, in a continuous $Al_2O_3$ matrix.

The particles may be evenly distributed throughout the matrix, or their distribution may be controlled to achieve, for example, a stratified structure of single-phase oxide matrix portions alternating with two or more phase matrix/particle portions, preferably distributed at controlled intervals throughout the depth of the matrix. Similarly, the deposition may be controlled to deposit a single-phase continuous portion of controlled depth of the matrix material below the two or more phase portion or the alternating single-phase/two or more phase portion of the coating.

The process involves the use of a mixture of gases including a mixture of two or more metal halides and other reactant gases under carefully controlled conditions to deposit by chemical vapor deposition (CVD) compounds of the metals on a substrate. The metal halides preferably are produced by passing halide gas or gases over the metals, for example metal particulates. For example, the metals may be combined as a mixture of metals, as a metal alloy, or as metal salts. A single halide gas is passed over the combined metals to form a mixture of metal halides. Alternatively, at least the metal forming the matrix is separate, and separate halide gas streams are passed over the metals to form separate metal halides, which are later combined. Carrier gases, for example Ar, may be combined with the halide gases. Preferred halide gases are $Cl_2$ and $HCl$, forming with the metals described above $AlCl_3$, $ZrCl_4$, and/or $YCl_3$. These are combined with suitable other gases such as $H_2$ and $CO_2$ or other volatile oxidizing gases such as $H_2O$.

One or more of the metals may be advantageously contained in a separate vessel within the CVD reactor. The gas enters the reactor via the separate vessel, the halide gas being converted by contact with the metal therein to the desired metal halide, which then enters the reactor to pass over the substrate. This method presents the advantage of utilizing the temperature gradient within the reactor, which can be accurately controlled in a multiple zone furnace or by way of location within the reactor, to control the temperature of the halide-metal reaction. Thus different metals in separate vessels may be disposed at different zones or positions within the reactor to control the reaction temperature for each.

In order to achieve a first-phase matrix containing discrete particles of a second phase or phases, it is important to control the relative deposition by controlling such parameters as gas flow rates to produce the desired deposition of first and second phase materials.

Further control over the deposition process may be achieved by pulsing the metal halide gas forming the second phase or phases while maintaining continuous flow of the metal halide gas forming the matrix. This pulsing method may also be used to control the distribution of the second phase within the matrix, for example to achieve either an even distribution or a stratified distribution as described above.

Likewise, a single metal halide gas may be allowed to flow, with the other reactant gases, for a period of time sufficient to deposit a continuous single-phase portion of the material comprising the matrix, before the two-phase portion or alternating single-phase/two or more phase portion of the coating is deposited.

Some examples of composite coatings according to the invention are: $Al_2O_3$ matrix/$ZrO_2$ particles, $ZrO_2$ matrix/$Y_2O_3$ particles, $Y_2O_3$ matrix/$ZrO_2$ particles, $Al_2O_3$ matrix/$Y_2O_3$ stabilized $ZrO_2$ particles, $Al_2O_3$ matrix/$Y_2O_3$ particles, and $Al_2O_3$ matrix/$ZrO_2$ particles and $Y_2O_3$ particles.

The terms second phase and two-phase as used herein refer to composites comprising a first phase, continuous oxide matrix compound and one or more additional or second phases which may be a single compound or more than one compound, in the form of discrete particles. The particles may be oxides of a single metal or a solid solution of oxides of more than one metal, and the individual particles maybe of the same or different compounds. The particles disclosed herein may be regularly shaped, as spheres, rods, whiskers, etc., or irregularly shaped.

The composite coatings according to the invention are fully dense, adherent, and make it possible to combine the wear resistant properties of two or more components without the problems associated with differences in expansion coefficients and adhesion presented by layering of continuous coatings of the materials.

Further improvement in the adhesion of the coating to the substrate may be achieved by depositing between the composite coating and the substrate a thin intermediate layer of TiC, TiN, or other carbide, nitride or carbonitride of Ti, Zr, Hf, Va, Nb, Ta, Cr, Mo, W, Si or B. Such deposition may be achieved in known manner as a preliminary part of the same coating process or in a separate, prior coating process. Similarly, for special applications, for example friction, cosmetic, wear or thermal purposes, a thin outer layer such as TiN may be applied in known manner over the composite coating.

Figure 2:
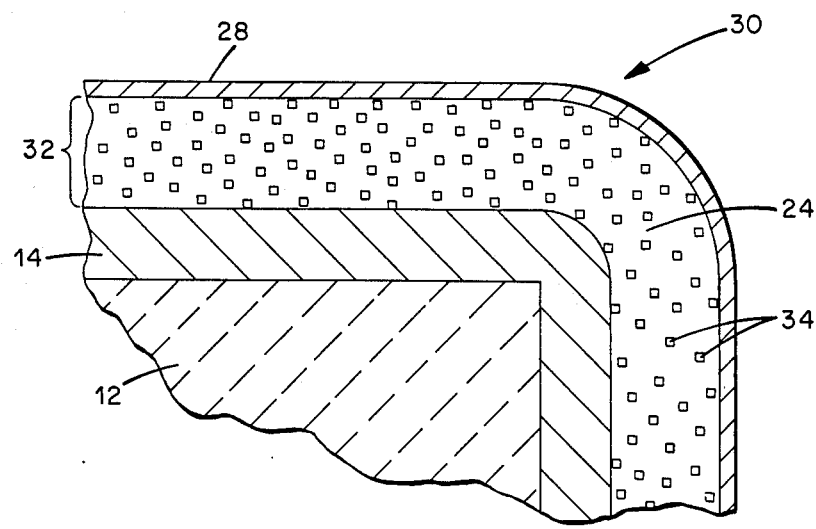

FIGS. 1 and 2, not drawn to scale, schematically illustrate typical coated articles 10 and 30 according to the invention. As shown in FIG. 1, substrate 12 is a shaped cemented WC material, and may be a cutting-tool or other article requiring wear resistance under the extreme conditions described above. A thin layer 14 of TiC covers the substrate, at least in the area subjected to wear. Composite layer 16 is deposited over TiC layer 14, and is made up of single-phase matrix portions 18 and 20 of $Al_2O_3$, and two-phase portions 22 of an $Al_2O_3$ matrix 24 and discrete particles 26 of $ZrO_2$. As shown in FIG. 1, there is no separation between the $Al_2O_3$ of matrix 24 of two-phase portions 22 and that of single-phase matrix portions 18 and 20. The $Al_2O_3$ of the composite coating is a single continuous matrix having a second phase of controlled composition and distribution dispersed therein. An outer layer 28 of TiN is deposited over the composite layer, giving article 10 a distinctive identifying color.

FIG. 2 illustrates an alternate embodiment of the article according to the invention. Like features in the two figures are identified by the same reference numerals. In FIG. 2, substrate 12 is overlaid with thin TiC layer 14 in the same manner as shown in FIG. 1. Composite layer 32 is deposited over TiC layer 14, and is made up of $Al_2O_3$ matrix 24 with particles 34 of $Y_2O_3$ stabilized $ZrO_2$ evenly distributed throughout matrix 24. Outer layer 28 of TiN is deposited over the composite layer.

The following Examples are presented to enable those skilled in this art to more clearly understand and practice the present invention. These Examples should not be considered as a limitation upon the scope of the invention, but merely as being illustrative and representative thereof.

EXAMPLES 1-6

After rinsing of all gas lines with their respective gases for 0.5-1 hr, samples of cutting tool inserts of a silicon nitride-based material, steel cutting grade, are coated with a layer of TiC about 3 microns thick by known techniques in a CVD reactor. An excess of pre-weighed zirconium metal chips is placed in a separate vessel disposed in the reactor. An excess of aluminum chips is placed in a vessel outside the reactor. The reactor is evacuated to about 10 torr, then heated under low pressure, while being flushed with flowing hydrogen, to increase the outgassing before deposition. Following the deposition procedure, the reactor is cooled, at the deposition pressure and while being flushed with hydrogen, to about 300° C., then under ambient pressure and flowing nitrogen to room temperature.

The deposition reaction conditions for Examples 1-6 are given in Table I, below. For all of these Examples the halide gas is $Cl_2$, the carrier gas for the Al and Zr reactions is Ar, and the other reactant gas is $CO_2$ with $H_2$ as a carrier. The $Cl_2$ flow rates are adjusted to give the metal chloride flow rates shown in Table I. The deposition pressure for Examples 1-6 is 50 torr; the temperature, 1040° C. For each of these Examples, a period of $Al_2O_3$ deposition (single-phase) ranging from 0.5 to 2.5 hrs is carried out before the two-phase $Al_2O_3/ZrO_2$ deposition is begun. During the single-phase deposition Ar gas is allowed to flow over the Zr, but the $Cl_2$ gas flow is shut off. The coating is deposited on the TiC underlayer as a stratified composite of alternating alumina and alumina/zirconia portions over a single-phase alumina portion, similar to that illustrated in FIG. 1, but without the TiN layer over the oxide coating. The oxide coating and the TiC underlayer show satisfactory thickness and good adherence. The inserts coated by the method according to the invention compare favorably with the materials in current commercial use.

TABLE I

| Ex. | Deposition | Flow Rate, ccpm Total/Reactant | $H_2$ vol % | $CO_2$ vol % | $AlCl_3$ vol % | $ZrCl_4$ vol % | Time hrs | $ZrCl_4$ Pulse |
|---|---|---|---|---|---|---|---|---|
| 1 | $Al_2O_3$ | 1420/1020 | 88 | 7 | 2.5 | 0 | 2 | none |
|   | $Al_2O_3/ZrO_2$ |  |  |  | 2.5 | 2.5 | 0.5 | 10 min each 20 mins |
| 2 | $Al_2O_3$ | 1420/1020 | 88 | 7 | 2.5 | 0 | 2 | none |
|   | $Al_2O_3/ZrO_2$ |  |  |  | 2.5 | 1.0 | 1 | 10 min each 20 mins |
| 3 | $Al_2O_3$ | 1420/1020 | 88 | 7 | 2.5 | 0 | 1 | none |
|   | $Al_2O_3/ZrO_2$ |  |  |  | 2.5 | 2.5 | 2.5 | 8 min each 22 mins |
| 4 | $Al_2O_3$ | 1420/1020 | 88 | 7 | 2.5 | 0 | 1 | none |
|   | $Al_2O_3/ZrO_2$ |  |  |  | 2.5 | 2.5 | 2.5 | 8 min each 22 mins |
| 5 | $Al_2O_3$ | 1420/1020 | 88 | 7 | 2.5 | 0 | 1 | none |
|   | $Al_2O_3/ZrO_2$ |  |  |  | 2.5 | 2.5 | 2.5 | 8 min each 22 mins |

TABLE I-continued

| Ex. | Deposition | Flow Rate, ccpm Total/Reactant | $H_2$ vol % | $CO_2$ vol % | $AlCl_3$ vol % | $ZrCl_4$ vol % | Time hrs | $ZrCl_4$ Pulse |
|---|---|---|---|---|---|---|---|---|
| 6 | $Al_2O_3$ | 1420/1020 | 88 | 7 | 2.5 | 0 | 1 | none |
|   | $Al_2O_3/ZrO_2$ |  |  |  | 2.5 | 2.5 | 2.5 | 8 min each 22 mins |

EXAMPLES 7-8

The process of Examples 1-6 is repeated for Examples 7 and 8, to coat the same type of TiC coated silicon nitride cutting tool inserts, except that both $AlCl_3$ and $ZrCl_4$ are flowing during the entire deposition period. The deposition pressure and temperature are 50 torr and 1040° C. respectively. The remaining reaction conditions are given in Table II below. The resulting composite coatings are similar to that illustrated in FIG. 2, except that no TiN layer is deposited over the oxide coating. The coating is a continuous $ZrO_2$ matrix with $Y_2O_3$ particles distributed therein. No single phase portion is deposited below the two phase portion of the oxide layer.

TABLE II

| Ex. | Flow Rate ccpm Total/Reactant | $H_2$ | $CO_2$ | $AlCl_2$ | $ZrCl_4$ | Time hrs. |
|---|---|---|---|---|---|---|
| 7 | 1420/1020 | 65.7 | 29.3 | 2.5 | 2.5 | 2.8 |
| 8 | 1100/800 | 88 | 7 | 2.5 | 2.5 | 3 |

While there has been shown and described what are at present considered the preferred embodiments of the invention, it will be obvious to those skilled in the art that various changes and modifications can be made therein without departing from the scope of the invention as defined in the appended claims.

We claim:

1. In a process for depositing a wear resistant ceramic coating on a hard ceramic substrate comprising the step of:

passing over the hard ceramic substrate a first gaseous mixture of a first halide vapor selected from the group consisting of halides of aluminum, yttrium and zirconium, one or more volatile oxidizing gases, and optionally a carrier gas, at a temperature of about 900°–1500° C., at a pressure between about 1 torr and about ambient pressure, and at partial pressure ratios, at a flow rate, and for a time sufficient to deposit a continuous, fully dense, adherent, wear resistant layer of a material selected from the group consisting of oxides of aluminum, zirconium, and yttrium about 0.1–20 microns thick on the hard ceramic substrate;

the improvement which comprises the step of:

mixing with the first gaseous mixture at least one additional vapor selected from the halides of aluminum, zirconium, and yttrium;

wherein the additional vapor is different from the first halide vapor, and is mixed at a partial pressure selected to form at least one discontinuous additional phase, dispersed as discrete particles within the continuous oxide layer, of at least one material selected from the group consisting of oxides of aluminum, zirconium, and yttrium, to form a wear resistant composite ceramic layer on the hard ceramic substrate.

2. A process according to claim 1 further comprising the step of depositing between the hard ceramic substrate and the composite ceramic layer at least one intermediate layer about 0.5–10 microns thick selected from the group consisting of carbides, nitrides, and carbonitrides of Ti, Zr, Hf, Va, Nb, Ta, Cr, Mo, W, Si and B.

3. A process for depositing a wear resistant composite ceramic coating on a hard ceramic substrate comprising the steps of:

passing over the hard ceramic substrate a first gaseous mixture of a first halide vapor selected from the group consisting of halides of aluminum, yttrium, and zirconium, one or more volatile oxidizing gases, and optionally a carrier gas, at a temperature of about 900°–1500° C. at a pressure between about 1 torr and about ambient pressure, wherein the one or more volatile oxidizing gases, the partial pressure ratios, the flow rates, and the deposition time are selected so that a continuous, fully dense, adherent, wear resistant first-phase layer of a material selected from the group consisting of oxides of aluminum, zirconium, and yttrium about 0.1–20 microns thick is deposited on the hard ceramic substrate; and intermittently, during the deposition of the continuous oxide of layer, pulsing into the first gaseous mixture to mix therewith at least one additional vapor selected from the halides of aluminum, zirconium, and yttrium, optionally mixed with a carrier gas;

wherein the at least one additional vapor is different from the first halide vapor and is mixed at a partial pressure, at time intervals, and for lengths of time selected to form at least one discontinuous additional phase, dispersed as discrete particles within the continuous oxide layer, of at least one material selected from the group consisting of oxides of aluminum, zirconium, and yttrium to form a wear resistant composite ceramic layer on the hard ceramic substrate.

4. A process according to claim 3 further comprising the step of controlling the size and distribution within the oxide layer of the additional phase particles by controlling the partial pressure, the time intervals, and the lengths of time at which the at least one additional vapor is pulsed into the first gaseous mixture.

5. A process according to claim 4 wherein the step of deposition of the continuous oxide layer is carried out for a sufficient time before the pulsing step is begun to form a single-phase, continuous oxide portion separating the hard ceramic substrate and the two or more phase portion of the composite ceramic coating.

6. A process according to claim 4 wherein the intermittent pulsing step occurs at time intervals and for times selected to form a stratified composite ceramic layer in which two or more phase portions alternate with single-phase, continuous oxide portions.

7. A process according to claim 3 further comprising the step of depositing between the hard ceramic substrate and the composite ceramic layer at least one intermediate layer about 0.5–10 microns thick selected from the group consisting of carbides, nitrides, and carbonitrides of Ti, Zr, Hf, Va, Nb, Ta, Cr, Mo, W, Si and B.

8. A process according to claim 3 further comprising the step of depositing between the hard ceramic substrate and the composite ceramic layer an intermediate layer of TiC or TiN about 2–5 microns thick; and wherein the first gaseous mixture consists essentially of 2.5–21 volume % $CO_2$, 47–64 volume % hydrogen, and 1.5–30 volume % $AlCl_3$, the remainder being argon, passing over the hard ceramic substrate at a temperature of 1000°–1100° C., a pressure of 50–100 torr, and a flow rate of 1100–1500 $cm^3$/min for 2.5 to 5 hr; and the at least one additional vapor is 0.5–2.5 volume % $ZrCl_4$ pulsed for about 1–10 min at intervals of about 2–6 times the pulse time, to deposit a composite ceramic layer consisting of a first, continuous phase of $Al_2O_3$ and a discontinuous additional phase of discrete grains of $ZrO_2$ dispersed within the $Al_2O_3$ first phase.

9. A process according to claim 8 further comprising the step of controlling the size and distribution within the oxide layer of the additional phase particles by controlling the partial pressure, the time intervals, and the lengths of time at which the at least one additional vapor is pulsed into the first mixture.

10. A process according to claim 8 wherein the intermediate layer is TiC about 3.0–3.5 microns thick; the first gaseous mixture consists essentially of about 7 volume % $CO_2$, 88 volume % hydrogen, 2.5 volume % $AlCl_3$, the remainder being argon, passing over the hard ceramic substrate at a temperature of about 1040° C., a pressure of about 50 torr, and a flow rate of about 1420 $cm^3$/min for about 3.5 hrs; and about 2.5 volume % $ZrCl_4$ is pulsed for about 8 min of each 22 min during the last 2.5 hrs.

11. A process for depositing a wear resistant composite coating on a hard ceramic substrate comprising the steps of:
passing a halide vapor, optionally mixed with a carrier gas, over a mixture or alloy of two or more metals selected from the group consisting of aluminum, zirconium, yttrium, and their metal salts, at about 250°–500° C., to form a first halide mixture comprising halides of two or more of aluminum, zirconium, and yttrium, and optionally the carrier gas;
mixing the first halide mixture one or more volatile oxidizing gases to form a first gaseous mixture; and
passing the first gaseous mixture over the hard ceramic substrate at a temperature of about 900°–500° C. and a pressure between about 1 torr and about ambient pressure, to deposit a composite layer on the hard ceramic substrate;
wherein the one or more volatile oxidizing gases, the flow rates of the gases, the surface areas and the ratio of the surface areas of the two or more metals, and the deposition time are selected so that the composite layer comprises an adherent layer about 0.1–20 microns thick of a continuous first phase of an oxide of one of the two or more of aluminum, zirconium, and yttrium, and at least one discontinuous additional phase, dispersed as discrete particles within the first-phase layer, of oxides of the remaining of the two or more of aluminum, zirconium, and yttrium.

12. A method according to claim 11 wherein the mixture or alloy of two or more metals consists essentially of a mixture or alloy of aluminum and zirconium or a mixture or alloy of zirconium and yttrium; the one or more volatile oxidizing gases comprise $CO_2$ with hydrogen as a carrier; and the composite layer comprises a continuous $Al_2O_3$ first phase having discrete particles of $ZrO_2$ dispersed therein, or a continuous $ZrO_2$ first phase having discrete particles of $Y_2O_3$ dispersed therein, or a continuous $Y_2O_3$ first phase having discrete particles of $ZrO_2$ dispersed therein.

13. A process according to claim 11 further comprising the step of depositing between the hard ceramic substrate and the composite layer at least one intermediate layer about 0.5–10 microns thick selected from the group consisting of the carbides, nitrides, and carbonitrides of Ti, Zr, Hf, Va, Nb, Ta, Cr, Mo, W, Si, and B.

14. A process for depositing a wear resistant composite coating on a hard ceramic substrate comprising the steps of:
passing a first gaseous halide, optionally mixed with a first carrier gas, over a first metal selected from the group consisting of aluminum, zirconium, yttrium, and metal salts thereof, at 250°–500° C., to form a gaseous first metal halide of aluminum, zirconium, or yttrium;
passing a second gaseous halide, which may be the same or different from the first gaseous halide, optionally mixed with a second carrier gas, which may be the same or different from the first carrier gas, over one or more additional metals selected from the group consisting of aluminum, zirconium, yttrium, and alloys and metal salts thereof, and different from the first metal, at about 250°–1500° C., to form one or more additional metal halides of one or more of aluminum, zirconium, and yttrium;
passing a gaseous mixture comprising the first metal halide, the one or more additional metal halides, optionally the carrier gases, and one or more volatile oxidizing gases over the hard ceramic substrate, at a temperature of about 900°–1500° C. and at a pressure between about 1 torr and about ambient pressure to deposit a composite layer on the hard ceramic substrate;
wherein the one or more volatile oxidizing gases, the flow rates of the vapors, the surface areas of the first metal and the one or more additional metals, and the deposition time are selected so that the composite layer comprises an adherent layer about 0.1–20 microns thick of a continuous first phase of an oxide of one of aluminum, zirconium, and yttrium, having at least one discontinuous additional phase of discrete particles of oxide(s) of one or more or aluminum, zirconium, and yttrium dispersed therein, the additional phase oxide(s) being different from the first-phase oxide.

15. A process according to claim 14 further comprising the step of depositing between the hard ceramic substrate and the composite layer at least one intermediate layer about 0.5–10 microns thick selected from the group consisting of the carbides, nitrides, and carbonitrides of Ti, Zr, Hf, Va, Nb, Ta, Cr, Mo, W, Si, and B.

16. A process according to claim 15 wherein the first metal is aluminum, the additional metal is zirconium, the first and second halides are both $Cl_2$ or HCl, and the intermediate layer is TiC.

17. A process according to claim 14 wherein the step of passing the first halide over the first metal is a continuous step, producing a steady flow of the first metal halide to pass over the hard ceramic substrate; and the step of passing the second halide over the one or more additional metals is an intermittent, pulsing step, producing pulses of the one or more additional metal halides to pass over the hard ceramic substrate with the first metal halide, wherein the second halide is pulsed at intervals and for times selected to control the size and distribution of the additional phase particles within the continuous first phase.

18. A process according to claim 14 wherein the first metal halide and the one or more volatile oxidizing gases are passed over the substrate for a sufficient time before the flow of the second halide is begun to deposit a single-phase, continuous portion of the composite layer separating the hard ceramic substrate and the two or more phase portion of the composite layer.

19. A process according to claim 14 wherein the step of passing the gaseous mixture over the hard ceramic substrate takes place within a reactor; and at least one of the first metal and the one or more additional metals is disposed within a separate vessel within the reactor, the separate vessel operationally communicating with a source of the associated gaseous halide, and optionally the associated carrier gas, and with the reactor, so that the associated gaseous halide enters the separate vessel, and passes over the metal(s) therein to form the metal halide(s), which flows into the reactor to pass over the hard ceramic substrate as a component of the gaseous mixture.

20. A process according to claim 19 wherein the first metal is aluminum or a metal salt thereof; and the one or more additional metals is zirconium or yttrium, or a metal salt thereof, or a mixture or alloy thereof, and is disposed within a separate vessel within the reactor.

21. A process according to claim 14 wherein the additional metal is aluminum, zirconium, yttrium or a metal salt thereof, and is different from the first metal; and further comprising the step of passing a third gaseous halide, which may be the same or different from the first and second gaseous halides, optionally mixed with a third carrier gas, which may be the same or different from the first and second carrier gases, over a third metal selected from the group consisting of aluminum, zirconium, yttrium, and metal salts thereof, and different from the first and additional metals, at about 250°–1500° C., to form a third metal halide of aluminum, zirconium, or yttrium; and wherein the gaseous mixture passing over the hard ceramic substrate further comprises the third metal halide, and the discontinuous additional phase further comprises discrete particles of oxides of two of aluminum, zirconium, and yttrium dispersed therein.

22. A process according to claim 21 wherein the step of passing the gaseous mixture over the hard ceramic substrate takes place within a reactor; and at least one of the first metal, the additional metal, and the third metal is disposed within a separate vessel within the reactor, the separate vessel operationally communicating with a source of the associated gaseous halide and optionally the associated carrier gas, and with the reactor, so that the associated gaseous halide enters the separate vessel, and passes over the metal therein to form the metal halide, which flows into the reactor to pass over the hard ceramic substrate as a component of the gaseous mixture.

* * * * *